(12) United States Patent
Arndt et al.

(10) Patent No.: US 6,173,720 B1
(45) Date of Patent: Jan. 16, 2001

(54) PROCESS FOR TREATING A SEMICONDUCTOR SUBSTRATE

(75) Inventors: Russell H. Arndt, Wappingers Falls, NY (US); Glenn Walton Gale, Austin, TX (US); Frederick William Kern, Jr., Colchester, VT (US); Karen P. Madden, Poughquag, NY (US); Harald F. Okorn-Schmidt, Putnam Valley, NY (US); George Francis Ouimet, Jr., Millbrook, NY (US); Dario Salgado, Kearny, NJ (US); Ryan Wayne Wuthrich, Burlington, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/203,927

(22) Filed: Dec. 2, 1998

(51) Int. Cl.$^7$ .................................................. H01L 21/302
(52) U.S. Cl. ................................. 134/1.3; 216/91; 216/99
(58) Field of Search ............................... 134/1.3; 216/91, 216/99

(56) References Cited

U.S. PATENT DOCUMENTS

| | | | |
|---|---|---|---|
| 3,813,311 | * 5/1974 | Beck et al. | 156/17 |
| 5,261,966 | * 11/1993 | Mashimo et al. | 134/2 |
| 5,294,570 | * 3/1994 | Fleming, Jr. et al. | 437/239 |
| 5,373,804 | * 12/1994 | Tachimori et al. | 117/13 |
| 5,382,296 | * 1/1995 | Anttila | 134/3 |
| 5,571,375 | * 11/1996 | Izumi et al. | 156/646.1 |
| 5,656,097 | * 8/1997 | Olesen et al. | 134/1 |
| 5,681,397 | * 10/1997 | Li | 134/2 |
| 5,882,433 | * 3/1999 | Ueno | 134/31 |

FOREIGN PATENT DOCUMENTS

| | | | |
|---|---|---|---|
| 19723918 | * | 5/1998 | (DE) . |
| 782177A2 | * | 7/1997 | (EP) . |
| 6-192861 | * | 7/1994 | (JP) . |
| 6-291099 | * | 10/1994 | (JP) . |
| 7-283182 | * | 10/1995 | (JP) . |
| 7-283191 | * | 10/1995 | (JP) . |
| 9-027469 | * | 1/1997 | (JP) . |
| 11080787 | * | 3/1999 | (JP) . |
| 2000056478 | * | 2/2000 | (JP) . |

OTHER PUBLICATIONS

"The Influence of Cyclic Treatments With H2O2 and HF Solutions on The Roughness of Silicon Surface"; Bull, Korean Chem. Soc. (1997); 18(7); Abstract Only; Lee et. al.*

"Surface Passivation and Microroughness of (100) Silicon Etched in Aqueous Hydrogen Halide (HF, HCl, HBr, HI) Solution"; Li et al.; J. Appl. Phys. (1995'); 77(3); pp. 1323–1325.*

Kinya, Washing Method and Apparatus Therfor, Patent Abstracts of Japan, Publication No. 09038595 A, Feb. 10, 1997.

Akira et al, Removal of Spontaneous Oxide Film in Contact Hole on Silicon Wafer, Patent Abstracts of Japan, Publication No. 05047742 A, Feb. 26, 1993.

Michiko et al, Method of Cleaning Silicon Substrate, Patent Abstracts of Japan, Publication No. 04320335 A, Nov. 11, 1992.

* cited by examiner

*Primary Examiner*—Gregory Mills
*Assistant Examiner*—George Goudreau
(74) *Attorney, Agent, or Firm*—Pollock, Vande Sande & Amernick; Jay H. Anderson

(57) ABSTRACT

Semiconductor substrates are contacted with a deionized water solution containing an acidic material.

19 Claims, No Drawings

PROCESS FOR TREATING A SEMICONDUCTOR SUBSTRATE

DESCRIPTION

1. Technical Field

The present invention relates to a method for treating a semiconductor substrate and especially for treating a silicon substrate in order to remove certain surface contamination so that it is hydrogen passivated and is suitable for subsequent growth or formation of such materials as a gate oxide, epitaxially grown silicon or a metallic silicide thereon.

2. Background of Invention

In fabricating semiconductor devices, the semiconductor substrates are liable to be contaminated in various ways. The contamination adversely affects the operating characteristics of the semiconductor devices that are subsequently fabricated on the substrates. Moreover, contamination reduces the production yield of the devices and in some cases may alter the very nature of the deposited film. Accordingly, various efforts have been undertaken to protect the silicon layer surfaces of semiconductor wafers from contamination in various steps of the manufacturing process.

For example, so-called "native" oxide films tend to form on freshly etched silicon due to exposure in air, water or the etching chemicals themselves. Typically, this "native" oxide is one to several monolayers thick and contains a variety of substituents in addition to $SiO_2$, such as C, H, S, N and various metals.

In order that the substrate be capable of subsequent processing such as low temperature epitaxial growth of silicon thereon, growth of oxide such as gate oxide by thermal oxidation, or forming of metallic silicides by reacting a metal such as a transition metal such as cobalt, platinum, palladium, tantalum or titanium with the underlying silicon substrate, the substrate must be an atomically clean surface, passivated with hydrogen and free from such contaminants as carbon and oxygen.

One of the more popular cleaning procedures used for creating a hydrogen passivated surface is to contact the surface with a hydrofluoric acid solution. Typically, the silicon substrate is dipped into a tank containing dilute hydrofluoric acid aqueous solution followed by a deionized (DI) water rinse and a drying process. The drying process typically is a spin dry or alcohol vapor drying procedure.

Reoxidation of the hydrogen passivated silicon surface will occur either as a result of oxygen dissolved in DI water (a difficult property to control) or from hydrolysis of the silicon-hydrogen bonds (a function of pH).

The post-etch surface condition desired is one where the silicon is terminated with hydrogen and also where contamination is removed or eliminated, a necessary condition for subsequent processes, such as low temperature epitaxy. This surface condition is especially significant and important in semiconductor manufacturing processes since the surface would remain stable for longer periods of time between completing the pre-clean process and beginning of the subsequent processes such as epitaxial deposition. Also, complete hydrogen-passivated surfaces have a very low surface charge (due to the low polarity of the Si—H bond) and are therefore attracting less airborne contamination such as organic molecules. Achieving such stability would accommodate the typical variations and cycle time delays between pre-clean completion and the beginning of the subsequent processing such as epitaxial deposition.

Attempts to achieve such a hydrogen-passivated surface have been tried. However, the prior methods generally produce a surface that is not sufficiently hydrogen passivated to be stable enough for a manufacturing process. The current most accepted method of treating silicon surfaces is with aqueous hydrofluoric acid followed by a deionized water rinse and either nitrogen spin dry, or displacement of water via alcohol and subsequent nitrogen drying. HF vapor has also been employed. However, HF vapor either with or without a deionized water rinse does not effectively hydrogen-passivate the silicon surface. In addition, high temperature processing in hydrogen has effectively removed carbon and oxygen impurities. However, requiring high temperatures can damage other structures previously fabricated on the wafer.

Accordingly, a demand still exists for providing a post-etch surface that is sufficiently hydrogen-passivated and free of oxygen, carbon and other contamination.

SUMMARY OF INVENTION

The present invention relates to a method for treating a silicon substrate which includes treating the substrate with HF acid, displacing with a low pH solution, displacing the low pH solution with an organic solvent, and then drying with an inert gas. The low pH solution employed according to the present invention can utilize a non-oxidizing inorganic acid, an organic carboxylic acid that boils lower than about 82° C. or mixtures thereof. It has been found according to the present invention that low pH solutions employed inhibit reoxidation of the semiconductor substrate as well as remove from or inhibit deposition on to the surface any other incidental contamination.

The surface can then be dryed resulting in a hydrogen passivated surface that is free of oxygen and carbon contamination.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS METHODS FOR CARRYING OUT INVENTION

The present invention relates to treating a semiconductor substrate and especially a silicon substrate in order to obtain a cleaned and hydrogen passivated substrate. Typically, the substrates treated according to the present invention have previously been processed such as with HF vapor or aqueous HF so as to remove previous films such as oxide from its surface. The aqueous HF pretreatment typically employs deionized aqueous solution having a water to HF ratio of about 10:1 to about 200:1. The substrate according to the present invention is contacted with or typically dipped in a low pH solution. Acidifying materials may be employed to reduce the pH and should minimize etching with respect to the semiconductor substrate or other desired films and should not leave any residue remaining on the substrate after the drying procedure. It is crucial that the semiconductor substrate after the treatment be free of oxygen and carbon on its surface.

Typical acids employed are non-oxidizing inorganic acids and organic carboxylic acids having a boiling point less than about 82° C. Of course, mixtures of acids can be employed when desired.

Suitable inorganic materials include hydrochloric acid (HCl), very dilute hydrofluoric acid (HF), and carbonic acid ($H_2CO_3$). The very dilute hydrofluoric acid typically includes at least about 100 parts by weight water per part of HF (by volume), preferably at least about 200 parts by weight water per part of HF (by volume) and more preferably about 200 parts to about 500 parts water per part of HF (by volume). Suitable organic acids include trifluoroacetic acid and trichloroacetic acid. The preferred material is carbonic acid or HF, since such have much less tendency to leave any harmful residue. The carbonic acid is typically obtained from $CO_2$ gas added to the water.

The pH of the deionized water composition is typically in the range of about 0.5 to about 6.5 and preferably about 1.5 to about 4.5 when the substrate is exposed to it.

As discussed above, it is critical that the acidifying material does not leave a residue on the substrate that could create an oxygen or carbon containing interface, leave particles or ionic containing residues on the surface. The above materials disclosed satisfy these conditions.

Typically according to the present invention, immediately after the acidified deionized water rinse, the substrate is then dried. For example, it can be dried by employing a non-reactive solvent of sufficient vapor pressure, such as isopropyl alcohol which will evaporate from the silicon surface without leaving a deleterious residue. Moreover, typically as a precautionary matter, an inert gas such as nitrogen can be used to flow against the substrate in order to remove any solvent that may have remained on it. Typically, the inert gas is caused to flow across the wafer at an elevated temperature such as about 20 to about 80° C.

The following non-limiting examples are presented to further illustrate the present invention.

EXAMPLE 1

A semiconductor silicon wafer is submerged in a solution consisting of 200 parts (volume) of water with 1 part (volume) of HF (200:1 solution). The 200:1 solution is then displaced with a solution of 450 parts water to 1 part HF (450:1). The 450:1 solution is then displaced with isopropyl alcohol and the wafer is dried using nitrogen gas. The 200:1 HF solution is employed to render the silicon surface free of oxide. Therefore, when using a second HF solution for the treating according to the present invention, the second solution is a more dilute HF solution than the first and typically at least twice as dilute.

EXAMPLE 2

A semiconductor or silicon wafer is submerged in a solution consisting of 200 parts (volume) of water with 1 part (volume) of HF (200:1 solution). The 200:1 solution is then displaced with deionized water saturated with $CO_2$, after which the wafer is dried using isopropyl alcohol vapor drying.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process for treating a semiconductor substrate which consists essentially of contacting said substrate with HF acid, followed by a deionized water solution containing at least one compound selected from the group consisting of $H_2CO_3$, and HF; and mixtures thereof to thereby provide a hydrogen passivated surface that is free of oxygen and carbon contamination.

2. The process of claim 1 wherein the substrate is a silicon substrate.

3. The process of claim 1 wherein the substrate is a silicon substrate that is free from oxide on the surface being treated.

4. The process of claim 1 wherein the compound is HF, wherein the HF is a solution which contains at least about 100 parts by weight of water per part of HF.

5. The process of claim 1 wherein the non-oxidizing inorganic compound is $H_2CO_3$.

6. The process of claim 1 wherein the at least one compound is HF.

7. The process of claim 4 wherein the HF solution contains at least about 200 parts by volume of water per part of HF.

8. The process of claim 6 wherein the HF solution contains about 200 parts by volume of water to about 500 parts by volume of water per part by volume of HF.

9. The process of claim 1 wherein the deionized water solution has a pH when the substrate contacts it of about 0.5 to about 6.5.

10. The process of claim 6 wherein the pH is about 1.5 to about 4.5.

11. The process of claim 1 which further comprises degassing the deionized water prior to adding the acidifying material.

12. The process of claim 1 which further comprises drying the substrate after the contact with the deionized water solution.

13. The process of claim 12 wherein the drying comprises removing deionized water solution from the substrate by employing a non-reactive solvent.

14. The process of claim 13 wherein the non-reactive solvent is isopropyl alcohol.

15. The process of claim 13 which further comprises flowing an inert gas across the substrate for removal of any residual solvent.

16. The process of claim 15 wherein the inert gas is nitrogen.

17. The process of claim 15 wherein the gas is at a temperature of about 20 to about 80° C.

18. The process of claim 1 wherein the HF acid is an aqueous solution of about 10 to about 400 parts by volume of water per part of HF.

19. A process for treating a semiconductor substrate which consists essentially of contacting said substrate with HF acid, followed by a deionized water solution containing at least one compound selected from the group consisting of a non-oxidizing inorganic acid, an organic carboxylic acid having a boiling point lower than about 82° C.; and mixtures thereof to thereby provide a hydrogen passivated surface that is free of oxygen and carbon; and wherein the deionized water is degassed prior to adding the at least one compound.

* * * * *

UNITED STATES PATENT AND TRADEMARK OFFICE
CERTIFICATE OF CORRECTION

PATENT NO. : 6,173,720 B1
DATED : January 16, 2001
INVENTOR(S) : Russell H. Arndt, Glenn Walton Gale, Fredrick William Kern, Jr., Karen P. Madden, Harald F. Okorn-Schmidt, George Francis Ouimet, Jr., Dario Salgado, Ryan Wayne Wuthrich.

It is certified that error appears in the above-identified patent and that said Letters Patent is hereby corrected as shown below:

Title page,
Item [56], under OTHER PUBLICATIONS, on the first line "H202" should be
-- $H_2O_2$ --

Signed and Sealed this

Second Day of October, 2001

Attest:

NICHOLAS P. GODICI
Attesting Officer
Acting Director of the United States Patent and Trademark Office